US010825702B2

(12) United States Patent
Shim et al.

(10) Patent No.: US 10,825,702 B2
(45) Date of Patent: Nov. 3, 2020

(54) METHOD AND DEVICE FOR SELF-ASSEMBLING SEMICONDUCTOR LIGHT-EMITTING DIODES

(71) Applicant: LG ELECTRONICS INC., Seoul (KR)

(72) Inventors: Bongchu Shim, Seoul (KR); Dohee Kim, Seoul (KR); Changseo Park, Seoul (KR); Hyunwoo Cho, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 3 days.

(21) Appl. No.: 16/388,394

(22) Filed: Apr. 18, 2019

(65) Prior Publication Data
US 2019/0326144 A1    Oct. 24, 2019

(30) Foreign Application Priority Data

Apr. 19, 2018  (KR) .................. 10-2018-0045723
Jul. 19, 2018  (KR) .................. 10-2018-0084147
Sep. 27, 2018  (WO) ................ PCT/KR2018/011438

(51) Int. Cl.
*H01L 21/67*     (2006.01)
*H01L 21/44*     (2006.01)
(Continued)

(52) U.S. Cl.
CPC ........ *H01L 21/67144* (2013.01); *B65G 47/92* (2013.01); *H01L 25/0753* (2013.01); *H01L 33/0093* (2020.05); *H01L 33/0095* (2013.01); *H01L 33/62* (2013.01); *H01L 2933/0066* (2013.01)

(58) Field of Classification Search
CPC .. H01L 33/0095; H01L 29/82; B65G 47/1442
See application file for complete search history.

(56) References Cited

U.S. PATENT DOCUMENTS 9,825,202 B2    11/2017  Schuele et al.
2002/0005294 A1  1/2002  Mayer et al.
(Continued)

FOREIGN PATENT DOCUMENTS

KR    10-2008-0099695 A    11/2008
KR       10-0885187 B1      2/2009
KR    10-2015-0005628 A     1/2015

*Primary Examiner* — Omar F Mojaddedi
(74) *Attorney, Agent, or Firm* — Birch, Stewart, Kolasch & Birch, LLP

(57) ABSTRACT

The present invention relates to a device and method for self-assembling semiconductor light-emitting diodes. Particularly, a method for manufacturing a display device according to the present invention includes: feeding a substrate to an assembly site and putting semiconductor light-emitting diodes having a magnetic material into a fluid chamber; applying a magnetic force to the semiconductor light-emitting diodes so that the semiconductor light-emitting diodes move in one direction within the fluid chamber; and guiding the semiconductor light-emitting diodes to preset positions on the substrate by applying an electric field, so that the semiconductor light-emitting diodes are mounted at the preset positions while in the process of being moved.

9 Claims, 10 Drawing Sheets

(51) Int. Cl.
  *H01L 25/075* (2006.01)
  *H01L 33/62* (2010.01)
  *B65G 47/92* (2006.01)
  *B65G 47/14* (2006.01)
  *B65G 47/49* (2006.01)
  *H01L 29/82* (2006.01)
  *H01L 33/00* (2010.01)

(56) References Cited

U.S. PATENT DOCUMENTS

| | | | |
|---|---|---|---|
| 2002/0013008 A1* | 1/2002 | Sanaka | H01L 24/95 438/15 |
| 2007/0087472 A1* | 4/2007 | Huber | H01L 24/95 438/106 |
| 2008/0023435 A1* | 1/2008 | Wu | H01L 24/95 216/2 |
| 2010/0192365 A1* | 8/2010 | Chow | H01L 24/95 29/739 |
| 2016/0111408 A1* | 4/2016 | Karlicek, Jr. | H01L 24/95 438/28 |
| 2017/0062393 A1* | 3/2017 | Kim | H01L 24/92 |
| 2017/0154919 A1* | 6/2017 | Chen | H01L 27/1259 |
| 2018/0102352 A1* | 4/2018 | Sasaki | H01L 25/50 |
| 2019/0115233 A1* | 4/2019 | Chen | H01L 24/95 |
| 2019/0242816 A1* | 8/2019 | Conner | G01N 33/04 |

* cited by examiner

METHOD AND DEVICE FOR SELF-ASSEMBLING SEMICONDUCTOR LIGHT-EMITTING DIODES

CROSS-REFERENCE TO RELATED APPLICATION

Pursuant to 35 U.S.C. § 119(a), this application claims the benefit of an earlier filing date of and the right of priority to Korean Application No. 10-2018-0045723 filed on Apr. 19, 2018 in the Republic of Korea, Korean Application No. 10-2018-0084147 filed on Jul. 19, 2018 in the Republic of Korea, and PCT International Application No. PCT/KR2018/011438 filed on Sep. 27, 2018, the contents of all of these applications are incorporated by reference herein in its their entirety.

BACKGROUND OF THE INVENTION

1. Field of the Invention

The present invention relates to a method for manufacturing a display device, and more particularly, to a method and device for self-assembling semiconductor light-emitting diodes.

2. Description of the Conventional Art

In recent years, in the field of display technology, liquid-crystal displays (LCD), organic light-emitting diode (OLED) displays, microLED displays, etc. have been competing to realize large-area displays.

However, LCDs have problems such as slow response times and the low efficiency of light produced by a backlight, and OLEDs have disadvantages such as short lifetimes, low mass-production yields, and low efficiency.

On the contrary, semiconductor microLEDs (µLED) with a diameter or cross-sectional area less than 100 microns, when used in displays, may offer very high efficiency because the displays do not need a polarizer to absorb light. However, large-scale displays require several millions of semiconductor light-emitting diodes, which makes it difficult to transfer the devices compared to other technologies.

Some of the technologies currently in development for the transfer process include pick & place, laser lift-off (LLO), and self-assembly. Among these technologies, the self-assembly approach is a method that allows semiconductor light-emitting diodes to find their positions on their own in a fluid, which is most advantageous in realizing large-screen display devices.

Recently, U.S. Pat. No. 9,825,202 disclosed a microLED structure suitable for self-assembly, but there is not enough research being carried out on technologies for manufacturing displays by the self-assembly of microLEDs. In view of this, the present invention proposes a new manufacturing method and device for self-assembling microLEDs.

SUMMARY OF THE INVENTION

One aspect of the present invention is to provide a new manufacturing process that provides high reliability in large-screen displays using micro-size semiconductor light-emitting diodes.

Another aspect of the present invention is to provide a manufacturing process that improves transfer accuracy when self-assembling semiconductor light-emitting diodes onto a temporary substrate or wiring substrate.

A method for manufacturing a display device according to the present invention involves a method for self-assembling semiconductor light-emitting didoes, which allows the semiconductor light-emitting diodes to be mounted at an assembly site by an electric field, while being moved in one direction by a magnetic field.

More specifically, there is provided a method for manufacturing a display device according to the present invention includes a method for self-assembling semiconductor light-emitting diodes, comprising: feeding a substrate to an assembly site and putting semiconductor light-emitting diodes having a magnetic material into a fluid chamber; applying a magnetic force to the semiconductor light-emitting diodes so that the semiconductor light-emitting diodes move in one direction within the fluid chamber; and guiding the semiconductor light-emitting diodes to preset positions on the substrate by applying an electric field, so that the semiconductor light-emitting diodes are mounted at the preset positions while in the process of being moved.

In an exemplary embodiment, the assembly site on the substrate may be a position at which the substrate is placed in the fluid chamber in such a way that an assembly surface where the semiconductor light-emitting diodes are assembled faces downwards.

In an exemplary embodiment of the present invention, the semiconductor light-emitting diodes may be moved horizontally to the substrate by the magnetic force, spaced apart from the substrate. The semiconductor light-emitting diodes may be moved vertically to the substrate by the electric field and mounted at preset positions on the substrate, while being moved horizontally to the substrate.

In an exemplary embodiment, the method for self-assembling semiconductor light-emitting diodes may further comprise, after the guiding of the semiconductor light-emitting diodes to the preset positions, moving the magnets in a direction in which the magnets get farther away from the substrate, so that the semiconductor light-emitting diodes remaining in the fluid chamber fall to the bottom of the fluid chamber.

Furthermore, the present invention provides a manufacturing device that can implement the above-described manufacturing process for self-assembling semiconductor light-emitting diodes by using a magnetic field and an electric field in combination.

Specifically, the manufacturing device is a device for self-assembling semiconductor light-emitting diodes, comprising: a fluid chamber with a space for containing a plurality of semiconductor light-emitting diodes having a magnetic material; a feed unit for feeding a substrate to an assembly site; magnets that are placed at a distance from the fluid chamber and apply a magnetic force to the semiconductor light-emitting diodes; and a position controller connected to the magnets and configured to control the positions of the magnets, wherein the substrate is configured to form an electric field so that the semiconductor light-emitting diodes are mounted at preset positions on the substrate while in the process of being moved by changes in the positions of the magnets.

In the exemplary embodiment of the present invention, the substrate may be placed in the fluid chamber so that an assembly surface where the semiconductor light-emitting diodes are assembled faces downwards. The assembly surface of the substrate may sink in a fluid in the fluid chamber. The magnets may be placed to face the opposite side of the assembly surface of the substrate.

In the exemplary embodiment of the present invention, the magnets may rotate in a horizontal, clockwise, or counterclockwise direction to the substrate.

In the exemplary embodiment of the present invention, the substrate may comprise: a base portion; a plurality of cells sequentially arranged in one direction along barrier walls protruding from the base portion; and a plurality of electrodes placed on the undersides of the cells.

The substrate may further comprise a dielectric layer that covers the electrodes when power is applied to the electrodes, so as to form the electric field within the cells, and forms the bottom of the cells. The self-assembly device may further comprise a power supply that is electrically connected to the electrodes so as to generate the electric field by applying power to the electrodes.

In the exemplary embodiment of the present invention, the fluid chamber may be formed with a light-transmissive bottom plate, and the semiconductor light-emitting diodes may be placed between the bottom plate and the substrate. The self-assembly device may further comprise an image sensor that is placed opposite the bottom plate so as to monitor the inside of the fluid chamber through the bottom plate.

With the above configuration according to the present invention, large numbers of semiconductor light-emitting diodes can be assembled at a time on a display device where individual pixels are made up of microLEDs.

As such, according to the present invention, large numbers of semiconductor light-emitting diodes can be pixelated on a small-sized wafer and then transferred onto a large-area substrate. This enables the manufacture of a large-area display device at a low cost.

Moreover, according to the manufacturing method and device of the present invention, a low-cost, high-efficiency, and quick transfer of semiconductor light-emitting diodes can be done, regardless of the sizes or numbers of parts and the transfer area, by transferring them in the right positions in a solution by using a magnetic field and an electric field.

Furthermore, the assembling of semiconductor light-emitting diodes by an electric field allows for selective assembling through selective electrical application without any additional equipment or processes. Also, since an assembly substrate is placed on top of a chamber, the substrate can be easily loaded or unloaded, and non-specific binding of semiconductor light-emitting diodes can be prevented.

Additionally, according to the manufacturing method and device of the present invention, a plurality of magnets are used for assembly, which reduces the area scanned with one magnet and therefore enables a large-area quick transfer. Further, the semiconductor light-emitting diodes remaining in the fluid chamber after assembly can be collected using magnets and re-used.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE PREFERRED EMBODIMENTS

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings.

Also, It will be understood that when an element, such as a layer, area or substrate is referred to as being "disposed on" another element, the element can be disposed directly on the another element or there are no intervening elements present.

Mobile terminals described herein may include cellular phones, smart phones, laptop computers, digital broadcasting terminals, personal digital assistants (PDAs), portable multimedia players (PMPs), navigators, slate PCs, tablet PC, ultra books, digital TVs, digital signage, head-mounted displays (HMDs), desk top computers and the like. However, it may be easily understood by those skilled in the art that the configuration according to the exemplary embodiments of this specification can also be applied to any device capable of displaying information even though such device is a new type of product to be developed.

Figure 1:
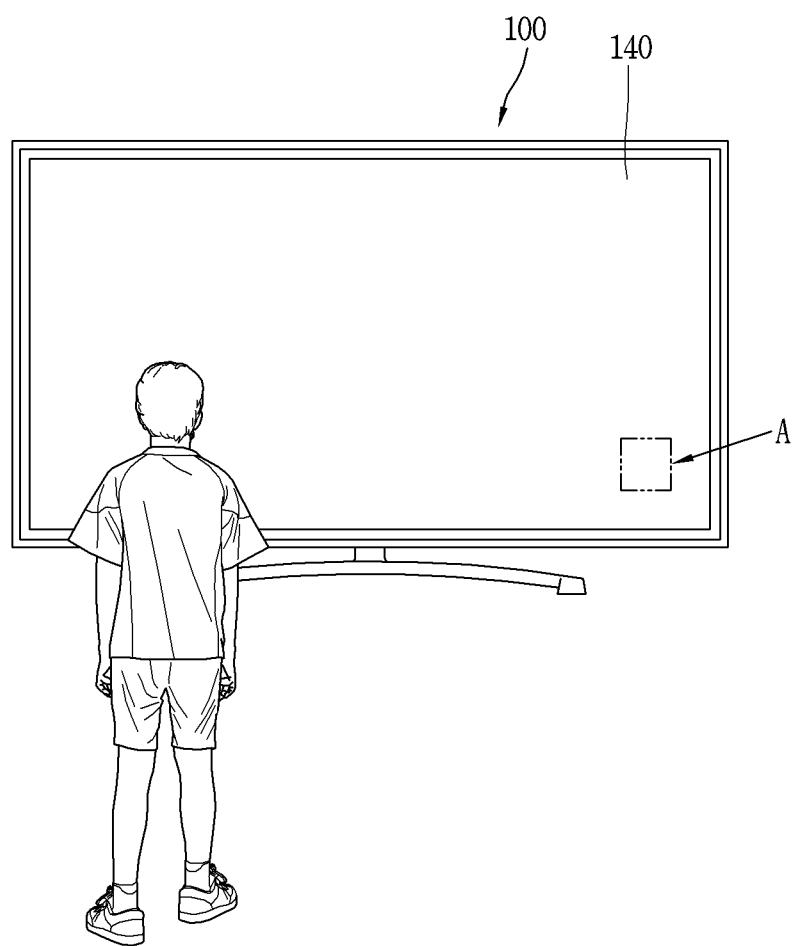
FIG. 1 is a conceptual diagram showing one embodiment of a display device using semiconductor light-emitting diodes according to the present invention.
Figure 2:
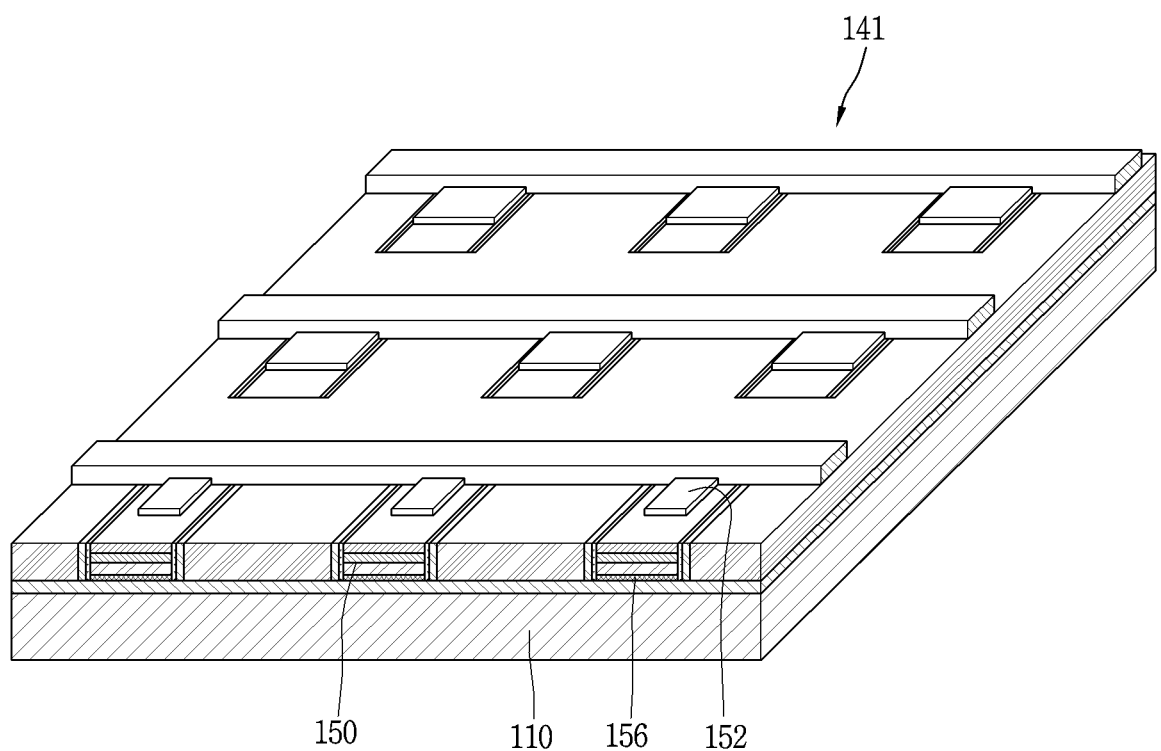
FIG. 2 is a partial enlarged view of the portion A in the display device of FIG. 1.
Figure 3:
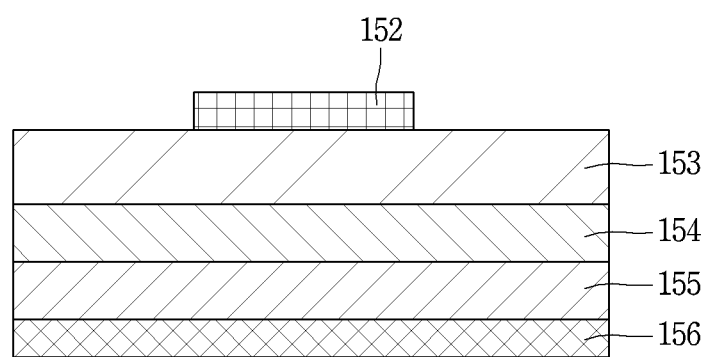
FIG. 3 is an enlarged view of the semiconductor light-emitting diodes of FIG. 2.
Figure 4:
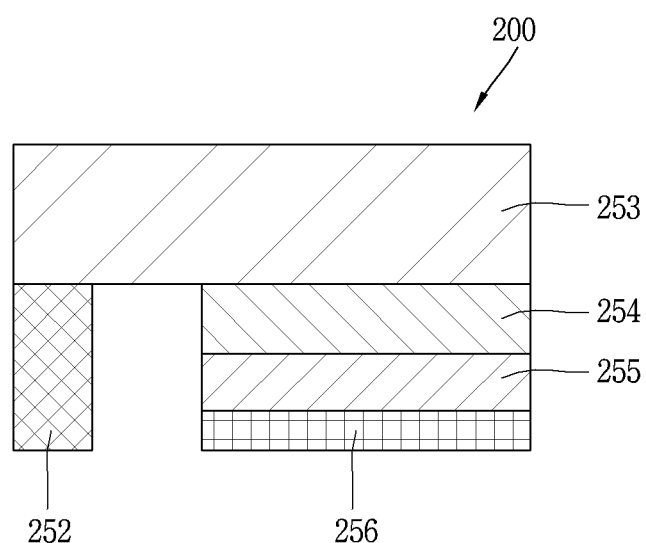
FIG. 4 is an enlarged view showing another embodiment of the semiconductor light-emitting diodes of FIG. 2.

FIG. 1 is a conceptual diagram showing one embodiment of a display device using semiconductor light-emitting diodes according to the present invention. FIG. 2 is a partial enlarged view of the portion A in the display device of FIG. 1. FIG. 3 is an enlarged view of the semiconductor light-emitting diodes of FIG. 2. FIG. 4 is an enlarged view showing another embodiment of the semiconductor light-emitting diodes of FIG. 2.

According to the illustration, information processed by a controller of a display device 100 may be outputted by a display module 140. An closed loop-shaped case 101 that runs around the edge of the display module may form the bezel of the display device.

The display module 140 comes with a panel 141 that displays an image, and the panel 141 may come with micro-sized semiconductor light-emitting diodes 150 and a wiring substrate 110 where the semiconductor light-emitting diodes 150 are mounted.

The wiring substrate 110 may be formed with wiring lines, which can be connected to n-type electrodes 152 and p-type electrodes 156 of the semiconductor light-emitting diodes 150. As such, the semiconductor light-emitting diodes 150 may be provided on the wiring substrate 110 as individual pixels that emit light on their own.

The image displayed on the panel 141 is visual information, which is rendered by controlling the light emission of unit pixels (sub-pixels) arranged in a matrix independently through the wiring lines.

The present invention takes microLEDs (light-emitting diodes) as an example of the semiconductor light-emitting diodes 150 which convert current into light. The microLEDs may be light-emitting diodes that are small in size—less than 100 microns. The semiconductor light-emitting diodes 150 have light-emitting regions of red, green, and blue, and unit pixels can produce light through combinations of these colors. That is, the unit pixels are the smallest units for producing one color. Each unit pixels may contain at least three microLEDs.

More specifically, referring to FIG. 3, the semiconductor light-emitting diodes 150 may have a vertical structure.

For example, the semiconductor light-emitting diodes 150 may be implemented as high-power light-emitting diodes that are composed mostly of gallium nitride (GaN), with some indium (In) and/or aluminum (Al) added to it, and emit light of various colors.

Such a vertical semiconductor light-emitting diode comprises a p-type electrode 156, a p-type semiconductor layer 155 formed on the p-type semiconductor layer 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 at the bottom may be electrically connected to a p electrode of the wiring substrate, and the n-type electrode 152 at the top may be electrically connected to an n electrode above the semiconductor light-emitting diode. One of the biggest advantages of the vertical semiconductor light-emitting diode 150 is that the chip size can be reduced by vertically aligning electrodes.

In another example, referring to FIG. 4, the semiconductor light-emitting diodes may be flip chip-type light-emitting diodes.

As an example of such a flip chip-type light-emitting diode, the semiconductor light-emitting diode 250 comprises a p-type electrode 256, a p-type semiconductor layer 255 formed on the p-type semiconductor layer 256, an active layer 254 formed on the p-type semiconductor layer 255, an n-type semiconductor layer 253 formed on the active layer 254, and an n-type electrode 252 vertically separated from the p-type electrode 256, on the n-type semiconductor layer 253. In this case, both the p-type electrode 256 and the n-type electrode 252 may be electrically connected to a p electrode and n electrode of the wiring substrate, below the semiconductor light-emitting diode.

The vertical semiconductor light-emitting diode and a horizontal light-emitting diode each may be used as a green semiconductor light-emitting diode, blue semiconductor light-emitting diode, or red semiconductor light-emitting diode. The green semiconductor light-emitting diode and the blue semiconductor light-emitting diode may be implemented as high-power light-emitting diodes that are composed mostly of gallium nitride (GaN), with some indium (In) and/or aluminum (Al) added to it, and emit green and blue light, respectively. As an example of such high-power light-emitting diodes, the semiconductor light-emitting diodes may be composed of gallium nitride thin films which are formed of various layers of n-Gan, p-GaN, AlGaN, InGaN, etc. More specifically, the p-type semiconductor layer may be P-type GaN, and the n-type semiconductor layer may be N-type GaN.

Moreover, the p-type semiconductor layer may be P-type GaN doped with Mg on the p electrode, and the n-type semiconductor layer may be N-type GaN doped with Si on the n electrode. In this case, the above-described semiconductor light-emitting diodes may come without the active layer.

Meanwhile, referring to FIGS. 1 to 4, because of the very small size of the light-emitting diodes, self-emissive, high-definition unit pixels may be arranged on the display panel, and therefore the display device can deliver high picture quality. In the above-explained display device using semiconductor light-emitting diodes according to the present invention, semiconductor light-emitting diodes are grown on a wafer, formed through mesa and isolation, and used as individual pixels. In this case, the micro-sized semiconductor light-emitting diodes 150 should be transferred onto a wafer, at preset positions on a substrate of the display panel. One of the transfer technologies available is pick and place, but it has a low success rate and requires a lot of time. In another example, a number of diodes may be transferred at a time by using a stamp or roll, which, however, is not suitable for large-screen displays because of limited yields. The present invention suggests a new method and device for manufacturing a display device that can solve these problems.

To this end, the new method for manufacturing a display device will be described first below. FIGS. 5A to 5E are conceptual diagrams for explaining a new process for manufacturing the above-described semiconductor light-emitting diodes.

In this specification, a display device using passive matrix (PM) semiconductor light-emitting diodes will be illustrated. It should be noted that the illustration given below also applies to active matrix (AM) semiconductor light-emitting diodes. Also, although the illustration will be given of how horizontal semiconductor light-emitting diodes are self-assembled, it also may apply to self-assembling of vertical semiconductor light-emitting diodes.

Figure 5A:
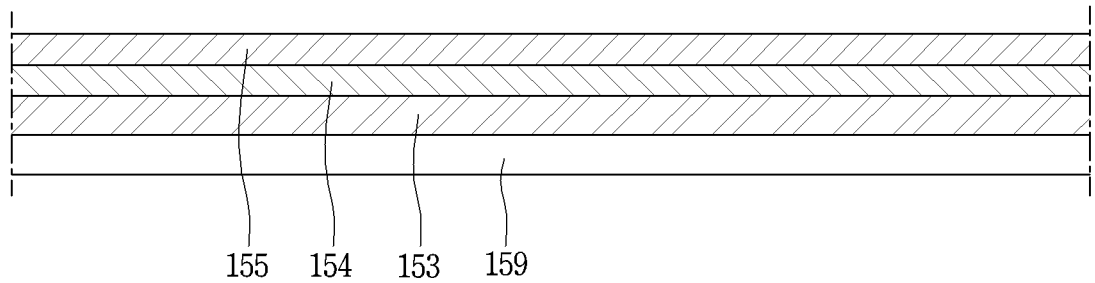
FIGS. 5A to 5E are conceptual diagrams for explaining a new process for manufacturing the above-described semiconductor light-emitting diodes.

First of all, according to the manufacturing method, a first conductive semiconductor layer 153, an active layer 154, and a second conductive semiconductor layer 155 are grown on a growth substrate 159 (FIG. 5A).

Once the first conductive semiconductor layer 153 is grown, then the active layer 154 is grown on the first conductive semiconductor layer 153, and then the second conductive semiconductor layer 155 is grown on the active layer 154. By sequentially growing the first conductive semiconductor layer 153, active layer 154, and second conductive semiconductor layer 155, the first conductive semiconductor layer 153, active layer 154, and second conductive semiconductor layer 155 form a stack structure as shown in FIG. 5A.

In this case, the first conductive semiconductor layer 153 may be a p-type semiconductor layer, and the second conductive semiconductor layer 155 may be an n-type semiconductor layer. However, the present invention is not necessarily limited to this, and the first conductive type may be n-type and the second conductive type may be p-type.

Moreover, although this exemplary embodiment is illustrated by assuming the presence of the active layer, the active layer may be omitted if necessary, as stated above. In an example, the p-type semiconductor layer may be P-type GaN doped with Mg, and the n-type semiconductor layer may be N-type GaN doped with Si on the n electrode.

The growth substrate 159 (wafer) may be formed of, but not limited to, light-transmissive material—for example, at least one among sapphire (Al2O3), GaN, ZnO, and AlO. Also, the growth substrate 159 may be made from a material suitable for growing semiconductor materials or carrier wafer. The growth substrate 159 may be formed of high thermal conducting material, and may be a conductive substrate or insulating substrate—for example, at least one among SiC, Si, GaAs, GaP, InP, and Ga2O3 substrates which have higher thermal conductivity than sapphire (Al2O3) substrates.

Figure 5B:
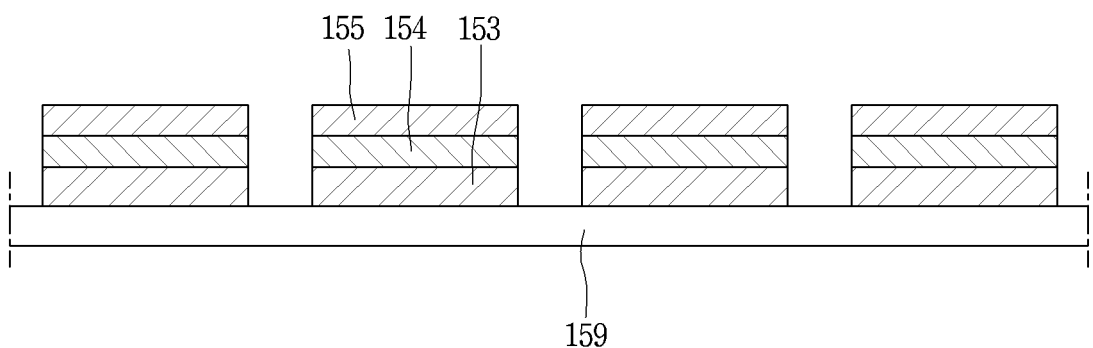

Next, a plurality of semiconductor light-emitting diodes are formed by removing at least part of the first conductive semiconductor layer 153, active layer 154, and second conductive semiconductor layer 155 (FIG. 5B).

More specifically, isolation is performed so that the light-emitting diodes form a light-emitting diode array. That is, a plurality of semiconductor light-emitting diodes are formed by vertically etching the first conductive semiconductor layer 153, active layer 154, and second conductive semiconductor layer 155.

In the case of horizontal semiconductor light-emitting diodes, a mesa process may be performed which exposes the first conductive semiconductor layer 153 to the outside by vertically removing part of the active layer 154 and second conductive layer 155, and then isolation may be performed which forms an array of semiconductor light-emitting diodes by etching the first conductive semiconductor layer 153.

Figure 5C:
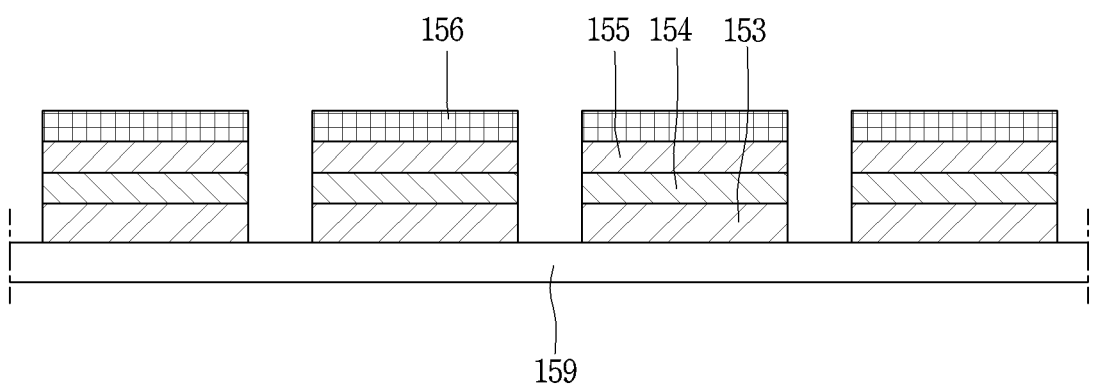

Next, a second conductive electrode 156 (or p-type electrode) is formed on one surface of the second conductive semiconductor layer 155 (FIG. 5C). The second conductive electrode 156 may be formed by a deposition method such as sputtering, but the present invention is not necessarily limited to this. In a case where the first conductive semiconductor layer and the second conductive semiconductor layer are an n-type semiconductor layer and a p-type semiconductor layer, respectively, the second conductive electrode 156 may serve as an n-type electrode.

Figure 5D:
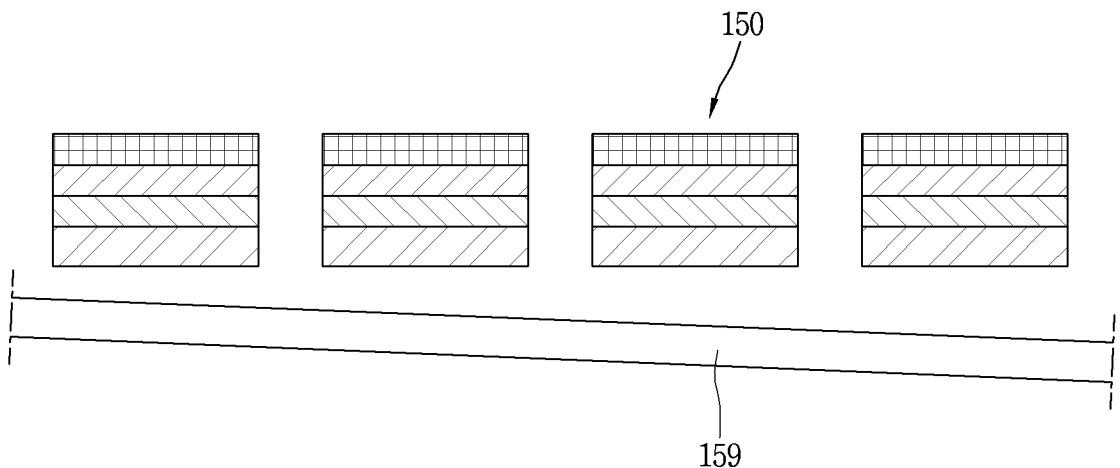

Next, the growth substrate 159 is removed, thus leaving a plurality of semiconductor light-emitting diodes. For example, the growth substrate 159 may be removed using laser lift-off (LLO) or chemical lift-off (CLO) (FIG. 5D).

Figure 5E:
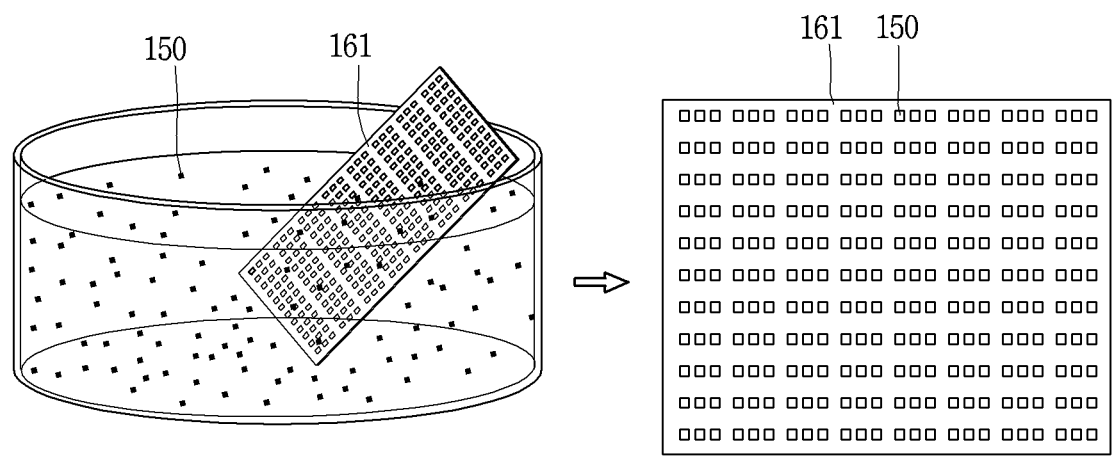

Afterwards, the step of mounting the semiconductor light-emitting didoes 150 on a substrate in a chamber filled with a fluid is performed (FIG. 5E).

For example, the semiconductor light-emitting diodes 150 and the substrate are put into the chamber filled with a fluid, and the semiconductor light-emitting diodes are self-assembled onto the substrate 161 using fluidity, gravity, surface tension, etc. In this case, the substrate may be an assembly substrate 161.

In another example, a wiring substrate, instead of the assembly substrate 161, may be put into a fluid chamber, and the semiconductor light-emitting diodes 150 may be mounted directly onto the wiring substrate. In this case, the substrate may be a wiring substrate. For convenience of explanation, the present invention is illustrated with an example in which the semiconductor light-emitting diodes 150 are mounted onto the assembly substrate 161.

To facilitate the mounting of the semiconductor light-emitting diodes 150 onto the assembly substrate 161, cells (not shown) into which the semiconductor light-emitting diodes 150 are fitted may be provided on the assembly substrate 161. Specifically, cells where the semiconductor light-emitting diodes 150 are mounted are formed on the assembly substrate 161, at positions where the semiconductor light-emitting diodes 150 are aligned with wiring electrodes. The semiconductor light-emitting diodes 150 are assembled to the cells as they move within the fluid.

After arraying the semiconductor light-emitting didoes on the assembly substrate 161, the semiconductor light-emitting diodes may be transferred to the wiring substrate from the assembly substrate 161, thereby enabling a large-area transfer across a large area. Thus, the assembly substrate 161 may be referred to as a temporary substrate.

Meanwhile, the above-explained self-assembly method requires a higher transfer yield so that it can be applied to the manufacture of large-screen displays. The present invention proposes a method and device that minimizes the effects of gravity or friction and avoids non-specific binding, in order to increase the transfer yield.

In this case, in the display device according to the present invention, a magnetic material is placed on the semiconductor light-emitting diodes so that the semiconductor light-emitting diodes are moved by magnetic force, and the semiconductor light-emitting diodes are mounted at preset positions by an electric field while in the process of being moved. This transfer method and device will be described in more details below with reference to the accompanying drawings.

Figure 6:
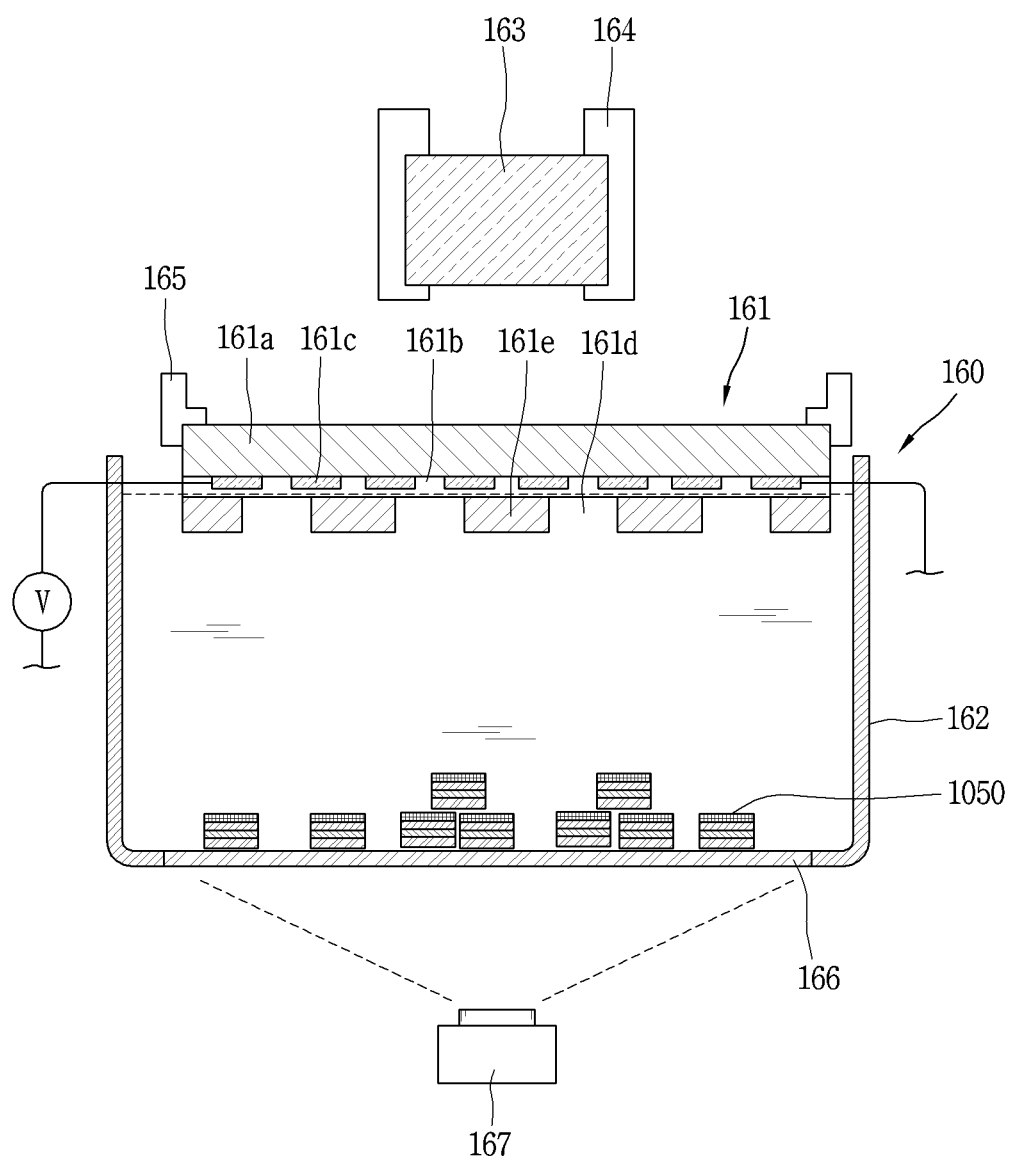
FIG. 6 is a conceptual diagram showing an example of a device for self-assembling semiconductor light-emitting diodes according to the present invention.
Figure 7:
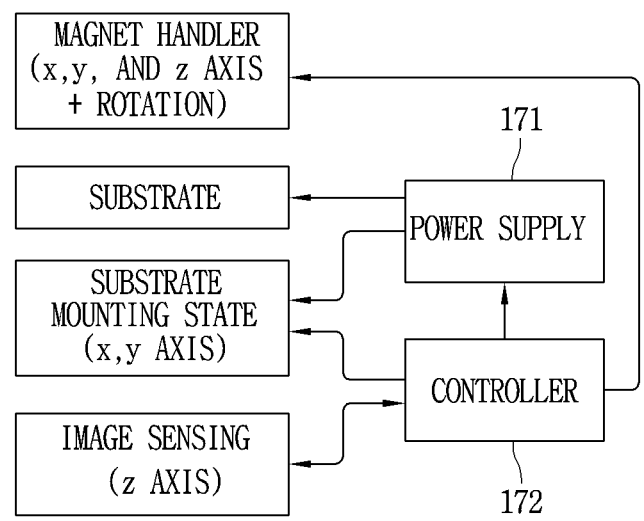
FIG. 7 is a block diagram of the self-assembly device of FIG. 6.

FIG. 6 is a conceptual diagram showing an example of a device for self-assembling semiconductor light-emitting diodes according to the present invention. FIG. 7 is a block diagram of the self-assembly device of FIG. 6. FIGS. 8A to 8E are conceptual diagrams showing a process for self-assembling semiconductor light-emitting diodes using the self-assembly device of FIG. 6. FIG. 9 is a conceptual diagram for explaining the semiconductor light-emitting diodes of FIGS. 8A to 8E.

Referring to FIGS. 6 and 7, the self-assembly device 160 of the present invention may comprise a fluid chamber 162, magnets 163, and a position controller 164.

The fluid chamber 162 is equipped with space for a plurality of semiconductor light-emitting diodes. The space may be filled with a fluid, and the fluid may be an assembly solution, which includes water or the like. Thus, the fluid chamber 162 may be a water tank and configured as open-type. However, the present invention is not limited to this, and the fluid chamber 162 may be a closed-type chamber that comes with a closed space.

A substrate 161 may be placed in the fluid chamber 162 so that an assembly surface where the semiconductor light-emitting diodes 150 are assembled faces downwards. For example, the substrate 161 is fed to an assembly site by a feed unit, and the feed unit may come with a stage 165 where the substrate is mounted. The position of the stage 165 may be adjusted by the controller, whereby the substrate 161 may be fed to the assembly site.

In this instance, the assembly surface of the substrate 161 at the assembly site faces the bottom of the fluid chamber 162. As shown in the drawings, the assembly surface of the substrate 161 is placed in such a way as to be soaked with the fluid in the fluid chamber 162. Thus, the semiconductor light-emitting diodes 150 in the fluid are moved to the assembly surface.

The substrate 161 is an assembly substrate where an electric field can be formed, and may comprise a base portion 161a, a dielectric layer 161b, and a plurality of electrodes 161c.

The base portion 161a is made of insulating material, and the electrodes 161c may be thin-film or thick-film bi-planar electrodes that are patterned on one surface of the base portion 161a. The electrodes 161c may be formed of a stack of Ti/Cu/Ti, Ag paste, ITO, etc.

The dielectric layer 161b may be made of inorganic material such as SiO2, SiNx, SiON, Al2O3, TiO2, HfO2, etc. Alternatively, the dielectric layer 161b may be an organic insulator and composed of a single layer or multi-layers. The thickness of the dielectric layer 161b may range from several tens of nm to several μm.

Further, the substrate 161 according to the present invention comprises a plurality of cells 161d that are separated by barrier walls 161e. The cells 161d may be sequentially arranged in one direction and made of polymer material. Also, the barrier walls 161e forming the cells 161d may be shared with neighboring cells 161d. The barrier walls 161e may protrude from the base portion 161a, and the cells 161d may be sequentially arranged in one direction along the barrier walls 161e. More specifically, the cells 161d may be sequentially arranged in column and row directions and have a matrix structure.

As shown in the drawings, the cells 161d may have recesses for containing the semiconductor light-emitting diodes 150, and the recesses may be spaces defined by the barrier walls 161e. The recesses may have a shape identical or similar to the shape of the semiconductor light-emitting diodes. For example, if the semiconductor light-emitting diodes are rectangular, the recesses may be rectangular too. Moreover, although not shown, the recesses formed in the cells may be circular if the semiconductor light-emitting diodes are circular. Further, each cell is configured to contain one semiconductor light-emitting diode. That is, one cell contains one semiconductor light-emitting diode.

Meanwhile, the plurality of electrodes 161c have a plurality of electrode lines that are placed at the bottom of the cells 161d, and the electrode lines may be configured to extend to neighboring cells.

The electrodes 161c are placed on the undersides of the cells 161d, and different polarities may be applied to create an electric field within the cells 161d. To form an electric field, the dielectric layer 161b may form the bottom of the cells 161d while covering the electrodes 161c. With this structure, when different polarities are applied to a pair of electrodes 161c on the underside of each cell 161d, an electric field is formed and the semiconductor light-emitting diodes can be inserted into the cells 161d by the electric field.

The electrodes of the substrate 161 at the assembly site are electrically connected to a power supply 171. The power supply 171 performs the function of generating an electric field by applying power to the electrodes.

As shown in the drawings, the self-assembly device may have magnets 163 for applying magnetic force to the semiconductor light-emitting diodes. The magnets 163 are placed at a distance from the fluid chamber 162 and apply a magnetic force to the semiconductor light-emitting diodes 150. The magnets 163 may be placed to face the opposite side of the assembly surface of the substrate 161, and the positions of the magnets 163 are controlled by the position controller 164 connected to the magnets 163.

The semiconductor light-emitting diodes 1050 may have a magnetic material so that they are moved within the fluid by a magnetic field.

Referring to FIG. 9, a semiconductor light-emitting diode having a magnetic material may comprise a first conductive electrode 1052, a second conductive electrode 1056, a first conductive semiconductor layer 1053 where the first conductive electrode 1052 is placed, a second conductive semiconductor layer 1055 which overlaps the first conductive semiconductor layer 1052 and where the second conductive layer 1056 is placed, and an active layer 1054 placed between the first and second conductive semiconductor layers 1053 and 1055.

Here, the first conductive may refer to p-type, and the second conductive type may refer to n-type, or vice versa. As stated previously, the semiconductor light-emitting diode may be formed without the active layer.

Meanwhile, in the present invention, the first conductive electrode 1052 may be formed after the semiconductor light-emitting diode is assembled onto the wiring substrate by the self-assembling of the semiconductor light-emitting diode. Further, in the present invention, the second conductive electrode 1056 may comprise a magnetic material. The magnetic material may refer a magnetic metal. The magnetic material may be Ni, SmCo, etc. In another example, the magnetic material may include at least one among Gd-based, La-based, and Mn-based materials.

The magnetic material may be provided in the form of particles on the second conductive electrode 1056. Alternatively, one layer of a conductive electrode comprising a magnetic material may be composed of the magnetic material. An example of this is the second conductive electrode 1056 of the semiconductor light-emitting diode 1050 which comprises a first layer 1056a and a second layer 1056b, as shown in FIG. 9. Here, the first layer 1056a may comprise a magnetic material, and the second layer 1056b may comprise a metal material other than the magnetic material.

As shown in the drawing, in this example, the first layer 1056a comprising the magnetic material may be placed in contact with the second conductive semiconductor layer 1055. In this case, the first layer 1056a is placed between the second layer 1056b and the second conductive semiconductor layer 1055. The second layer 1056b may be a contact metal that is connected to the wiring electrode on the wiring substrate. However, the present invention is not necessarily limited to this, and the magnetic material may be placed on one surface of the first conductive semiconductor layer.

Referring again to FIGS. 6 and 7, more specifically, on top of the fluid chamber of the self-assembly device, a magnet handler capable of automatically or manually moving the magnets 163 on the x, y, and z axes or a motor capable of rotating the magnets 163 may be provided. The magnet handler and motor may constitute the position controller 164. As such, the magnets 163 may rotate in a horizontal, clockwise, or counterclockwise direction to the substrate 161.

Meanwhile, the fluid chamber 162 may be formed with a light-transmissive bottom plate 166, and the semiconductor light-emitting diodes may be placed between the bottom plate 166 and the substrate 161. An image sensor 167 may be placed opposite the bottom plate 166 so as to monitor the inside of the fluid chamber 162 through the bottom plate 166. The image sensor 167 may be controlled by a controller 172, and may come with an inverted-type lens, CCD, etc. so as to observe the assembly surface of the substrate 161.

The above-explained self-assembly device is configured to use a magnetic field and an electric field in combination. With this, the semiconductor light-emitting diodes are mounted at preset positions on the substrate by an electric field while in the process of being moved by changes in the positions of the magnets. Below, the assembly process using the above-explained self-assembly device will be described in more details.

First of all, a plurality of semiconductor light-emitting diodes 1050 having a magnetic material may be formed through the process explained with reference to FIGS. 5A to 5C. In this case, the magnetic material may be deposited onto the semiconductor light-emitting didoes in the process of forming the second conductive electrode of FIG. 5C.

Figure 8A:
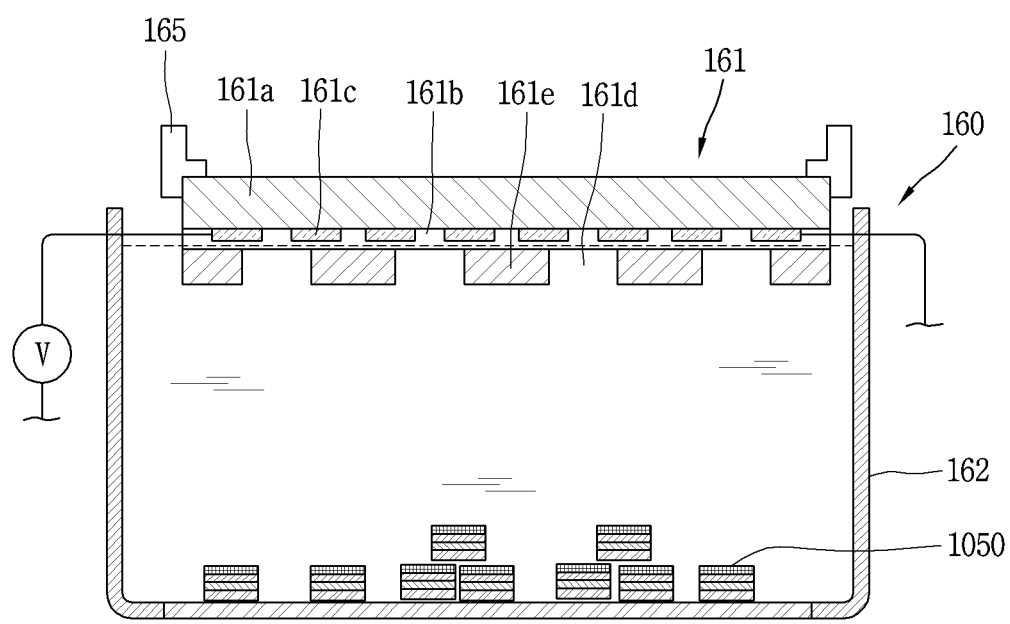
FIGS. 8A to 8E are conceptual diagrams showing a process for self-assembling semiconductor light-emitting diodes using the self-assembly device of FIG. 6.
Figure 9:
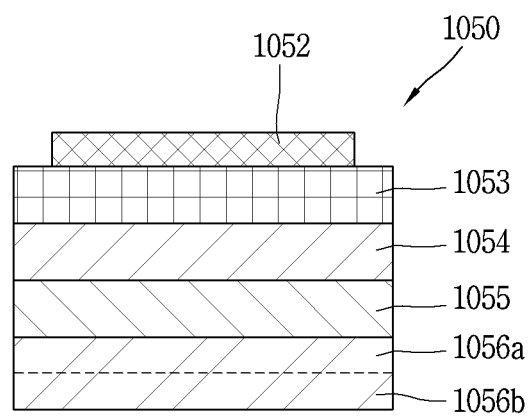
FIG. 9 is a conceptual diagram for explaining the semiconductor light-emitting diodes of FIGS. 8A to 8E.

Next, the substrate 161 is fed to an assembly site, and the semiconductor light-emitting diodes 1050 are put into the fluid chamber 162 (FIG. 8A).

As described above, the assembly site on the substrate 161 may be a position at which the substrate 161 is placed in the fluid chamber 162 in such a way that an assembly surface where the semiconductor light-emitting diodes 150 are assembled faces downwards.

In this case, some of the semiconductor light-emitting diodes 1050 may sink to the bottom of the fluid chamber 162 and some of them may float in the fluid. If the fluid chamber 162 comes with a light-transmissive bottom plate 166, some of the semiconductor light-emitting diodes 1050 may sink to the bottom plate 166.

Figure 8B:
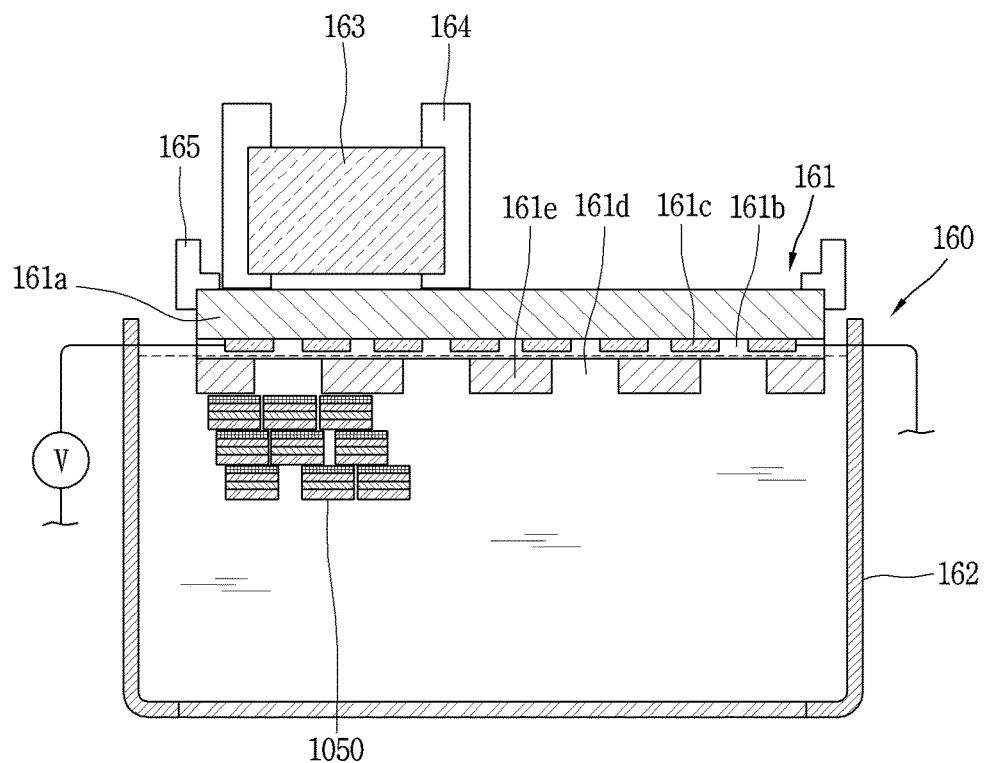

Next, a magnetic force is applied to the semiconductor light-emitting diodes 1050 so that the semiconductor light-emitting diodes 1050 in the fluid chamber 162 come up to the surface (FIG. 8B).

When the magnets 163 of the self-assembly device move to the opposite side of the assembly surface of the substrate 161 from their original positions, the semiconductor light-emitting diodes 1050 float in the fluid towards the substrate 161. The original positions may refer to positions at which the magnets 163 are outside the fluid chamber 162. In another example, the magnets 163 may be composed of electromagnets. In this case, an initial magnetic force is generated by supplying electricity to the electromagnets.

Meanwhile, in this embodiment, the assembly surface of the substrate 161 and the spacing between the semiconductor light-emitting diodes 1050 may be controlled by adjusting the strength of the magnetic force. For example, the spacing is controlled by using the weight, buoyancy, and magnetic force of the semiconductor light-emitting diodes 1050. The spacing may be several millimeters to several tens of micrometers from the outermost part of the substrate 161.

Figure 8C:
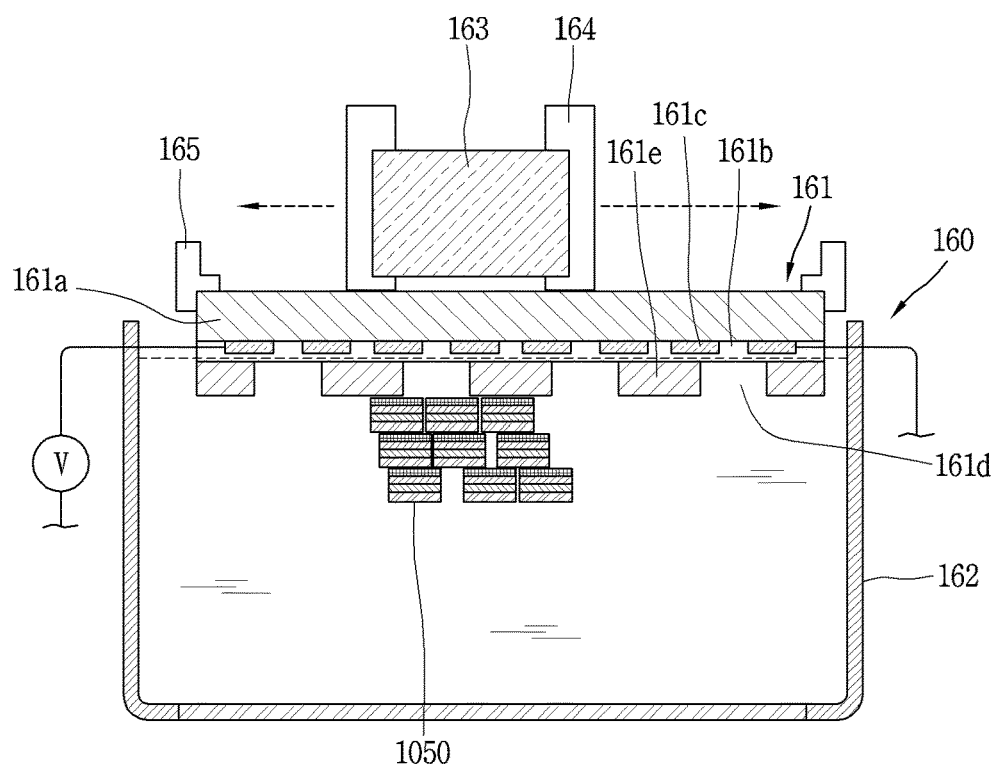

Next, a magnetic force is applied to the semiconductor light-emitting diodes 1050 so that the semiconductor light-emitting diodes 1050 move in one direction within the fluid chamber 162. For example, the magnets 163 may move in a horizontal, clockwise, or counterclockwise direction to the substrate 161 (FIG. 8C). In this case, the semiconductor light-emitting diodes 1050 are moved horizontally to the substrate 161 by the magnetic force, spaced apart from the substrate 161.

Next, the semiconductor light-emitting diodes 1050 are guided to preset positions on the substrate 161 by applying an electric field so that the semiconductor light-emitting diodes 1050 are mounted at the preset positions while in the process of being moved (FIG. 8C). For example, the semiconductor light-emitting diodes 1050 are moved vertically to the substrate 161 by the electric field and mounted at preset positions on the substrate 161, while being moved horizontally to the substrate 161.

More specifically, an electric field is generated by supplying power to bi-planar electrodes on the substrate 161, and the semiconductor light-emitting diodes 1050 are guided to the preset positions and assembled only there by the electric field. That is, the semiconductor light-emitting diodes 1050 are self-assembled at an assembly site on the substrate 161 by a selectively generated electric field. To this end, the substrate 161 may be formed with cells into which the semiconductor light-emitting diodes 1050 are fitted.

Afterwards, the unloading of the substrate 161 is performed, thereby completing the assembly process. In a case where the substrate 161 is an assembly substrate, an array of semiconductor light-emitting diodes may be transferred onto a wiring substrate to carry out a subsequent process for realizing the display device, as described previously.

Figure 8D:
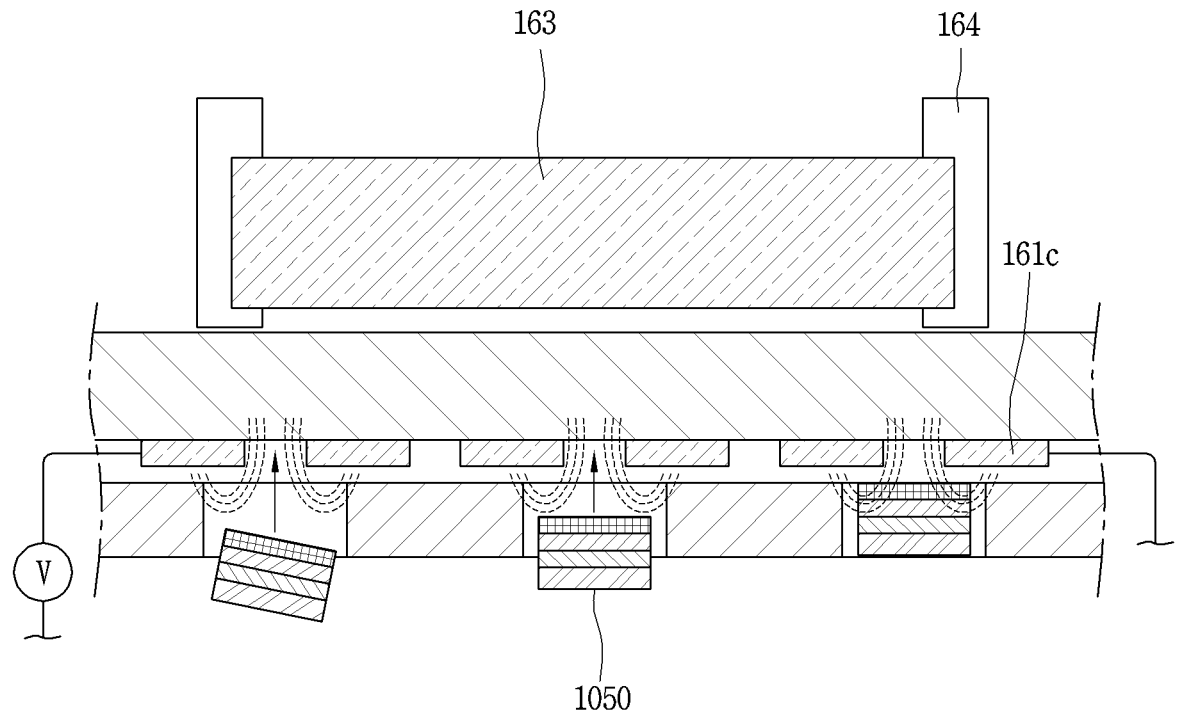
Figure 8E:
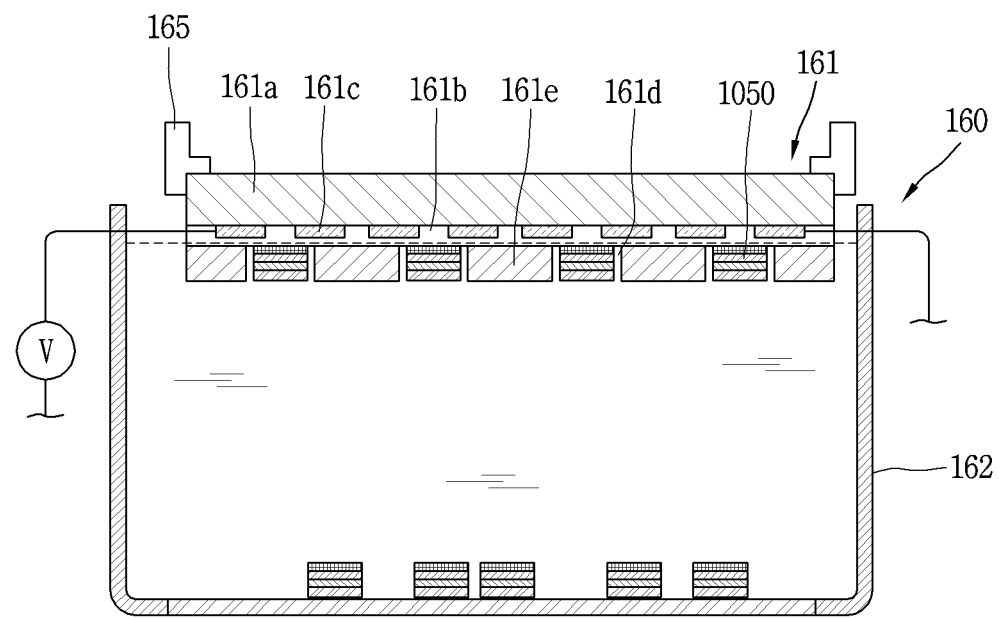

Meanwhile, after the semiconductor light-emitting diodes 1050 are guided to the preset positions, the magnets 163 may be moved in a direction in which they get farther away from the substrate 161, so that the semiconductor light-emitting diodes 1050 remaining in the fluid chamber 162 fall to the bottom of the fluid chamber 162 (FIG. 8D). In another example, if power supply is stopped in a case where the magnets 163 are electromagnets, the semiconductor light-emitting diodes 1050 remaining in the fluid chamber 162 fall to the bottom of the fluid chamber 162.

Thereafter, the semiconductor light-emitting diodes 1050 on the bottom of the fluid chamber 162 may be collected, and the collected semiconductor light-emitting diodes 1050 may be re-used.

In the above-explained self-assembly device and method, parts distant from one another are concentrated near a preset assembly site by using a magnetic field in order to increase assembly yields in a fluidic assembly, and the parts are selectively assembled only at the assembly site by applying an electric field to the assembly site. In this case, the assembly substrate is positioned on top of a water tank, with its assembly surface facing downward, thus minimizing the effect of gravity from the weights of the parts and avoiding non-specific binding and eliminating defects.

As seen from above, with the above configuration according to the present invention, large numbers of semiconductor light-emitting diodes can be assembled at a time on a display device where individual pixels are made up of semiconductor light-emitting diodes.

As such, according to the present invention, large numbers of semiconductor light-emitting diodes can be pixelated on a small-sized wafer and then transferred onto a large-area substrate. This enables the manufacture of a large-area display device at a low cost.

What is claimed is:

1. A device for self-assembling a plurality of semiconductor light-emitting diodes, the device comprising:
    a fluid chamber with a space configured to contain a fluid to allow movement of the plurality of semiconductor light-emitting diodes having a magnetic material;
    a feeder to feed a substrate to an assembly site;
    a magnet placed at a distance from the fluid chamber and configured to apply a magnetic force to the plurality of semiconductor light-emitting diodes; and
    a position controller connected to the magnet and configured to control positions of the magnet,
    wherein the substrate is configured to form an electric field so that the plurality of semiconductor light-emitting diodes will be mounted at preset positions on the substrate while in a process of being moved by changes in the positions of the magnet, and wherein the substrate comprises:

a base portion;

a plurality of electrodes placed on the substrate, and a dielectric layer that covers the plurality of electrodes when power is applied to the plurality of electrodes, so that the electric field is formed;

wherein the substrate is placed in the fluid chamber so that an assembly surface where the plurality of semiconductor light-emitting diodes are assembled faces downwards;

wherein the assembly surface of the substrate is dipped in the fluid in the fluid chamber;

wherein the magnet is placed to face the opposite side of the assembly surface of the substrate.

2. The device of claim 1, wherein the magnet is configured to rotate in a horizontal, clockwise, or counterclockwise directions to the substrate.

3. The device of claim 1, wherein the substrate further comprises:

a plurality of cells sequentially arranged in one direction along barrier walls protruding from the base portion, and wherein the plurality of electrodes are placed on undersides of the plurality of cells.

4. The device of claim 3, wherein the dielectric layer forms a bottom of the plurality of cells, and the dielectric layer is interposed between the plurality of semiconductor light-emitting diodes and the plurality of electrodes so that the plurality of semiconductor light-emitting diodes are not in direct contact with the plurality of the electrodes.

5. The device of claim 3, further comprising a power supply that is electrically connected to the plurality of electrodes so as to generate the electric field by applying power to the plurality of electrodes.

6. The device of claim 1, wherein the fluid chamber includes a light-transmissive bottom plate, and the plurality of semiconductor light-emitting diodes are placed between the light-transmissive bottom plate and the substrate.

7. The device of claim 6, further comprising an image sensor that is placed opposite the light-transmissive bottom plate so as to monitor the inside of the fluid chamber through the light-transmissive bottom plate.

8. The device of claim 1, wherein the magnetic material is provided in a form of particles in a layer, or a layer of the magnetic material.

9. The device of claim 1, wherein a spacing between the plurality of semiconductor light-emitting diodes is controlled by adjusting a strength of the magnetic force.

* * * * *